(12) United States Patent
Chiang et al.

(10) Patent No.: US 9,984,985 B1
(45) Date of Patent: May 29, 2018

(54) SEMICONDUCTOR PACKAGE DEVICE WITH ANTENNA ARRAY

(71) Applicant: Advanced Semiconductor Engineering, Inc., Kaohsiung (TW)

(72) Inventors: Chung-Hsin Chiang, Kaohsiung (TW); Kuang-Ting Chi, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days. days.

(21) Appl. No.: 15/406,514

(22) Filed: Jan. 13, 2017

(51) Int. Cl.
  *H01L 23/66* (2006.01)
  *H01L 23/31* (2006.01)
  *H01L 23/58* (2006.01)
  *H01L 23/538* (2006.01)
  *H01L 23/00* (2006.01)

(52) U.S. Cl.
  CPC .......... *H01L 23/66* (2013.01); *H01L 23/3121* (2013.01); *H01L 23/5384* (2013.01); *H01L 23/5386* (2013.01); *H01L 23/585* (2013.01); *H01L 24/17* (2013.01); *H01L 2223/6677* (2013.01)

(58) Field of Classification Search
  CPC ............ H01L 2224/94; H01L 2224/95; H01L 2224/96; H01L 2224/97; H01L 2224/0237; H01L 2224/02371; H01L 2224/02372; H01L 2224/02373; H01L 2224/02375; H01L 2224/02377; H01L 2224/02379; H01L 2224/02381; H01L 2223/6616; H01L 2223/6622; H01L 2223/6627; H01L 2223/6677; H01L 2224/0401; H01L 2224/04; H01L 2224/04026; H01L 2224/04034; H01L 2224/04042; H01L 2224/0405; H01L 2224/04073; H01L 2224/04105; H01L 2224/05; H01L 2224/06; H01L 2224/12
  See application file for complete search history.

(56) References Cited

U.S. PATENT DOCUMENTS

| | | | |
|---|---|---|---|
| 7,477,197 B2 | 1/2009 | Zeng et al. | |
| 8,718,550 B2 | 5/2014 | Zhao et al. | |
| 8,912,959 B2 | 12/2014 | Chiu et al. | |
| 2015/0084208 A1 | 3/2015 | Iida et al. | |

(Continued)

*Primary Examiner* — Marcos D Pizarro
*Assistant Examiner* — Shannon Yi
(74) *Attorney, Agent, or Firm* — Foley & Lardner LLP; Cliff Z. Liu

(57) ABSTRACT

The present disclosure provides for a semiconductor package device. The semiconductor package device includes a substrate, a first antenna, an electronic component, a package body and a second antenna. The substrate includes a first surface, a second surface opposite to the first surface and a first lateral surface extending between the first surface and the second surface. The first antenna is disposed on the first surface of the substrate. The electronic component is disposed on the second surface of the substrate. The package body is disposed on the second surface of the substrate and encapsulates the electronic component. The package body has a first lateral surface substantially coplanar with the first lateral surface of the substrate. The second antenna is disposed on the first lateral surface of the substrate and on the first lateral surface of the package body.

20 Claims, 5 Drawing Sheets

(56) References Cited

U.S. PATENT DOCUMENTS

| | | |
|---|---|---|
| 2016/0172317 A1 | 6/2016 | Tsai et al. |
| 2016/0197048 A1 * | 7/2016 | Bar et al. |
| 2017/0033468 A1 * | 2/2017 | Wong .................... H01P 1/2005 |
| 2017/0047634 A1 * | 2/2017 | Kato .................... G06K 19/077 |

* cited by examiner

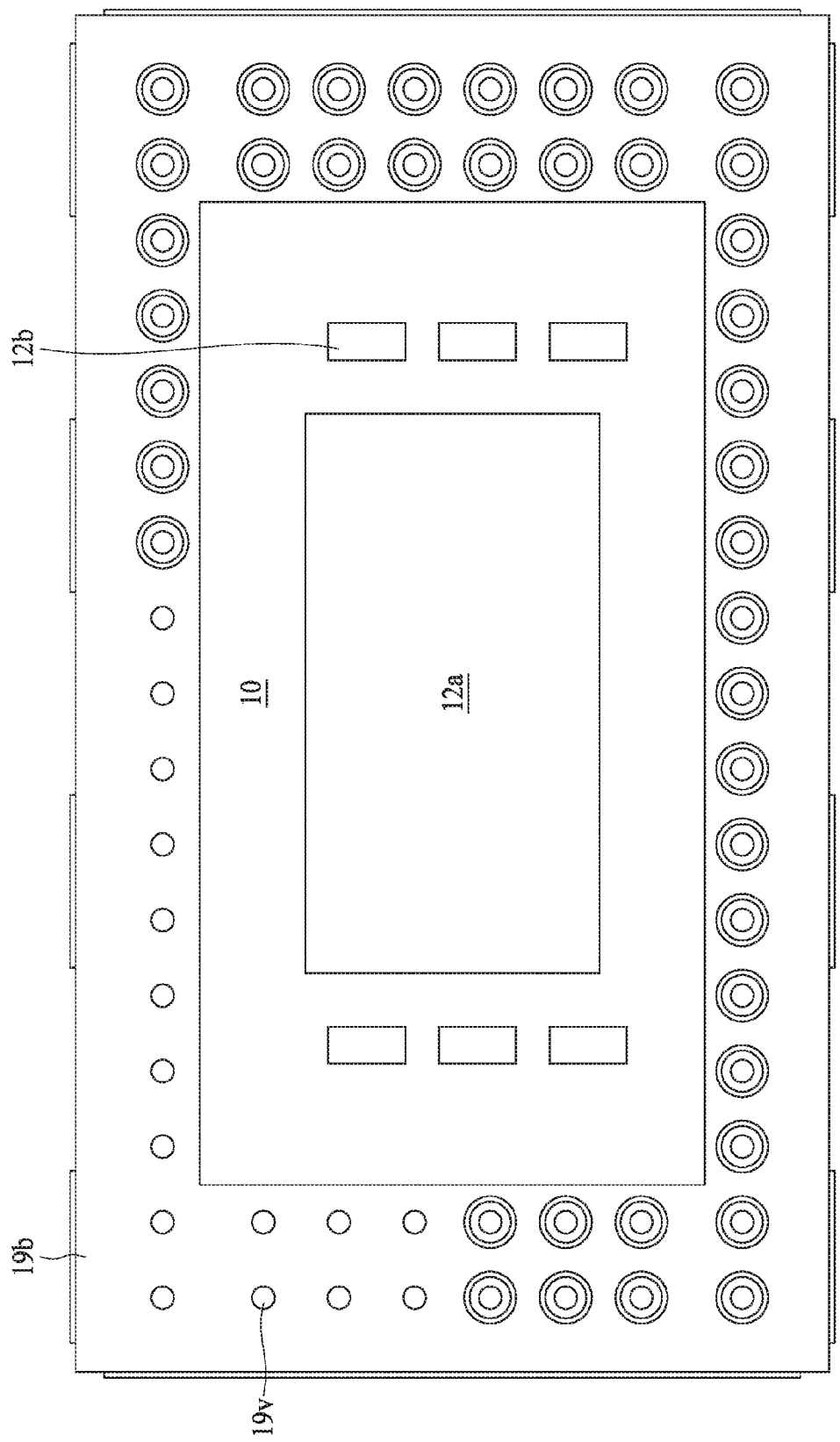

SEMICONDUCTOR PACKAGE DEVICE WITH ANTENNA ARRAY

BACKGROUND

1. Technical Field

The present disclosure relates to a semiconductor package device, and more particularly, to a semiconductor package device with an antenna array.

2. Description of the Related Art

Wireless communication devices, such as cell phones, can include antennas for transmitting and receiving radio frequency (RF) signals. Some wireless communication devices include an antenna and a communication module, each disposed on different parts of a circuit board. Under some approaches, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. In addition, an RF signal transmission path between the antenna and the communication module may be long, thereby reducing quality of a signal transmitted between the antenna and the communication module.

SUMMARY

In an aspect according to some embodiments, a semiconductor package device includes a substrate, a first antenna, an electronic component, a package body and a second antenna. The substrate includes a first surface, a second surface opposite to the first surface and a first lateral surface extending between the first surface and the second surface. The first antenna is disposed on the first surface of the substrate. The electronic component is disposed on the second surface of the substrate. The package body is disposed on the second surface of the substrate and encapsulates the electronic component. The package body has a first lateral surface substantially coplanar with the first lateral surface of the substrate. The second antenna is disposed on the first lateral surface of the substrate and on the first lateral surface of the package body.

In another aspect according to some embodiments, a semiconductor package device includes a substrate, a first antenna, an electronic component, a package body, a first metal strip and a second metal strip. The substrate includes a first surface, a second surface opposite to the first surface, a first lateral surface extending between the first surface and the second surface and a second lateral surface opposite to the first lateral surface. The first antenna is disposed on the first surface of the substrate. The electronic component is disposed on the second surface of the substrate. The package body is disposed on the second surface of the substrate and encapsulates the electronic component. The package body has a first lateral surface substantially coplanar with the first lateral surface of the substrate and a second lateral surface substantially coplanar with the second lateral surface of the substrate. The first metal strip is disposed on the first lateral surface of the substrate and on the first lateral surface of the package body. The second metal strip is disposed on the second lateral surface of the substrate and on the second lateral surface of the package body. The second metal strip electrically connects to the first metal strip.

In another aspect according to some embodiments, a semiconductor package device includes a substrate, an electronic component, a package body and a first antenna. The substrate includes a first surface, a second surface opposite to the first surface, a first lateral surface extending between the first surface and the second surface, a first metal layer and a second metal layer. The electronic component is disposed on the second surface of the substrate. The package body is disposed on the second surface of the substrate and encapsulates the electronic component. The package body has a first lateral surface coplanar with the first lateral surface of the substrate. The first antenna is disposed on the first lateral surface of the substrate and on the first lateral surface of the package body. The first antenna electrically connects to the first metal layer of the substrate.

BRIEF DESCRIPTION OF THE DRAWINGS

FIG. 1C illustrates a bottom view of a semiconductor package device in accordance with some embodiments of the present disclosure.

Figure 1A:
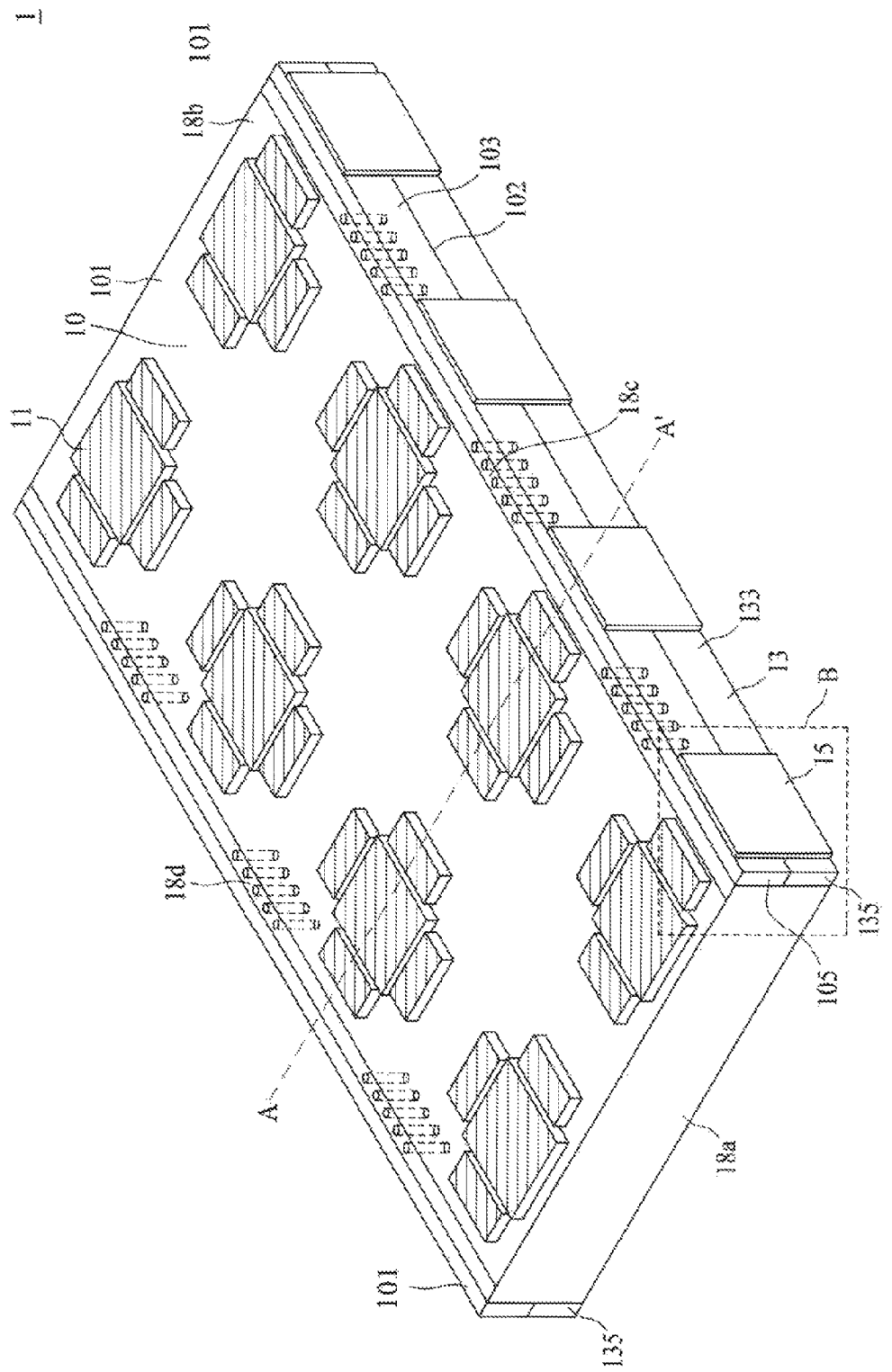
FIG. 1A illustrates a perspective view of a semiconductor package device in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

FIG. 1A illustrates a perspective view of a semiconductor package device 1 in accordance with some embodiments of the present disclosure. The semiconductor package device 1 includes a substrate 10, a first antenna array 11, a second antenna array 15, a package body 13, metal strips 18a, 18b and metal lines 18c, 18d.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. The substrate has a surface 101 and a surface 102 opposite to the surface 101. In some embodiments, the surface 101 of the substrate is referred to as a top surface or a first surface and the surface 102 of the substrate is referred to as a bottom surface or a second surface. The substrate 10 further has lateral surfaces 103 and 105. The lateral surface 103 extends between the first surface 101 and the first surface 102. The lateral surface 105 extends between the first surface 101 and the first surface 102 and is adjacent to the lateral surface 103. The lateral surface 105 may have a surface normal that is orthogonal to a surface normal of the lateral surface 103.

The package body 13 is disposed on the second surface 102 of the substrate 10. In some embodiments, the package body 13 includes an epoxy resin having fillers dispersed therein. The package body 13 has a lateral surface 133 substantially coplanar with the lateral surface 103 of the substrate 10. The package body 13 further has a lateral surface 135 substantially coplanar with the lateral surface 105 of the substrate 10.

The first antenna array 11 is disposed on the first surface 101 of the substrate 10. In some embodiments, the first antenna array 11 includes eight antennas. Alternatively, the number of the antennas included in the first antenna array 11 can be adjusted based on design requirements, and can be any number of antennas. The first antenna array 11 is configured to radiate a directional radiation pattern. The radiation pattern might be, for example, broadside or perpendicular to the first surface 101 of the substrate 10. In some embodiments, the first antenna array 11 includes broadside antennas. The first antenna array 11 may be electrically connected with electronic components through electrical connections within the substrate 10.

The second antenna array 15 is disposed on the lateral surface 103 of the substrate 10 and the lateral surface 133 of the package body 13. In some embodiments, the second antenna array 15 includes four antennas. Alternatively, the number of the antennas included in the second antenna array 15 can be adjusted based on design requirements, and can be any number of antennas. The second antenna array 15 is configured to radiate a directional radiation pattern. The pattern might be perpendicular to the lateral surface 103 of the substrate 10. In some embodiments, the second antenna array 15 includes end-fire antennas. In some embodiments, components of the end-fire antenna array can be also disposed on a lateral surface of the substrate 10 opposite to the lateral surface 103 of the substrate 10, and/or on a lateral surface of the package body 13 opposite to the lateral surface 133 of the package body 13.

The metal strip 18a is disposed on the lateral surface 105 of the substrate 10 and on the lateral surface 135 of the package body 13. The metal strip 18a may be formed of one or more materials, and more than half of the metal strip 18a, by weight, may be metal materials. In some embodiments, the metal strip 18b can be disposed on a lateral surface of the substrate 10 opposite to the lateral surface 105 of the substrate 10, and on a lateral surface of the package body opposite to the lateral surface 135 of the package body 13. The metal strip 18b may be formed of one or more materials, and more than half of the metal strip 18b, by weight, may be metal materials. The metal line 18c is disposed at an edge of the first surface 101 of the substrate 10 and electrically connects the metal strip 18a with the metal strip 18b. The metal line 18c may be formed of one or more materials, and more than half of the metal line 18c, by weight, may be metal materials. The metal line 18d is disposed at an opposite edge of the first surface 101 of the substrate 10 from the edge on which the metal line 18c is disposed, and electrically connects the metal strip 18a with the metal strip 18b. The metal line 18d may be formed of one or more materials, and more than half of the metal line 18d, by weight, may be metal materials. The metal line 18c is spaced apart from the metal line 18d. The metal strips 18a, 18b and the metal lines 18c, 18d surround the first antenna array 11 and, together with the first surface 101 of the substrate 10, define a cavity, which, in conjunction with a reflector of the second antenna array 15, can enhance a gain of the first antenna array 11 and the second antenna array 15.

In some wireless devices, an antenna array and other electronic components are integrated into a single package device to reduce the total size of the wireless devices. However, due to a limited space of a clean area on which the antenna array can be disposed, it can be difficult to improve a performance (such as gain or bandwidth) of the antenna array. In accordance with some embodiments of the present disclosure, by disposing the first antenna array 11 (e.g., broadside antenna array) on the first surface 101 of the substrate 10 and disposing the second antenna array 15 (e.g., end-fire antenna array) on the lateral surfaces 103, 133 of the substrate 10 and the package body 13, the clean area on which the second antenna array is disposed can be increased without increasing the size of the package device. Therefore, for a given size, the semiconductor package device 1 can accommodate more antennas than some other wireless devices, which can in turn increase the performance of the antenna array.

Figure 1B:
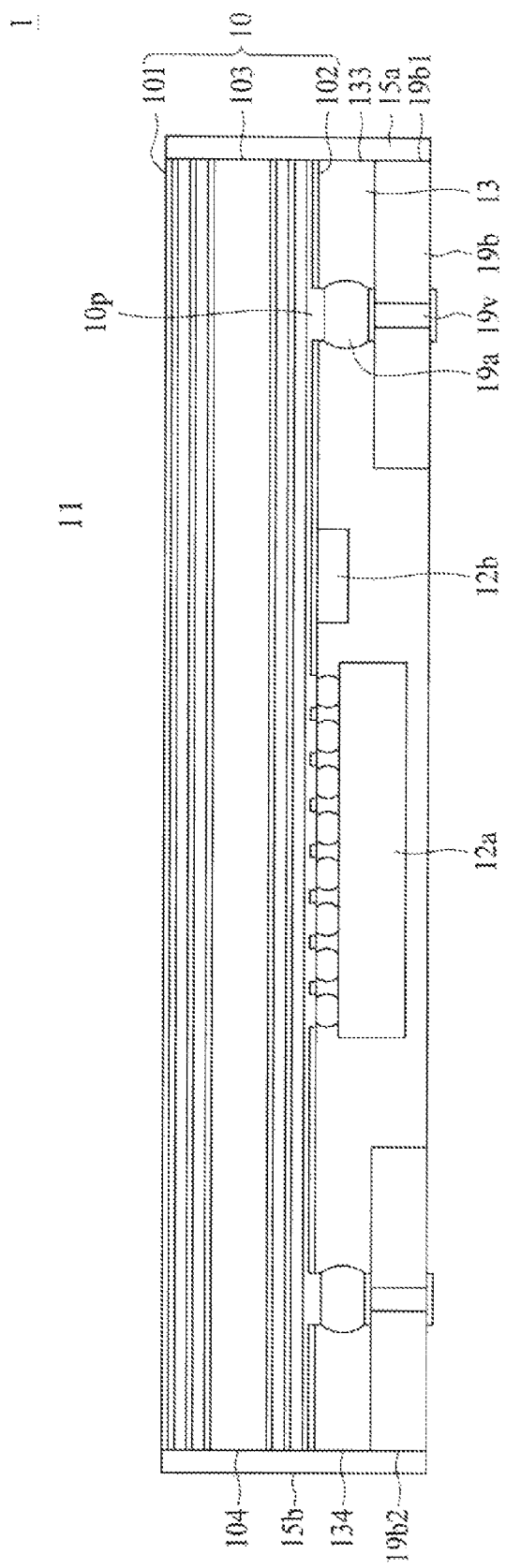
FIG. 1B illustrates a cross-sectional view of a semiconductor package device in accordance with some embodiments of the present disclosure.

FIG. 1B is illustrates a cross-sectional view of across line A-A' of the semiconductor package device 1 shown in FIG. 1A. As shown in FIG. 1B, electronic components 12a and 12b are disposed on the second surface 102 of the substrate 10. The electrical component 12a may be an active component, such as an integrated circuit (IC) chip (e.g., power amplifier or filter) or a die. The electrical component 12b may be a passive electrical component, such as a capacitor, a resistor or an inductor. Each electrical component 12a, 12b may be electrically connected to one or more components or antennas of the first antenna array 11 through electrical connections within substrate 10. The electronic components 12a, 12b may be connected to the second surface 102 of the substrate 10 by way of flip-chip or wire-bond techniques, for example.

An interposer 19b is disposed over the second surface 102 of the substrate 10. The interposer 19b may include at least one via 19v traversing the interposer 19b, which can be used to establish one or more electrical connections. One end of the via 19v is electrically connected with a conductive pad 10p disposed on the second surface 102 of the substrate through one or more solder balls 19a. The solder balls 19a and interposer 19b may provide electrical connections for the semiconductor package device 1. The interposer 19b may include, for example, a printed circuit board, such as a paper-based copper foil laminate, a composite copper foil laminate, or a polymer-impregnated glass-fiber-based copper foil laminate. The interposer 19b and the solder balls 19a may be arranged at or near a periphery of the second surface 102 of the substrate 10.

The package body 13 is disposed on the second surface 102 of the substrate 10 and covers the electronic components 12a, 12b, the solder balls 19a and a portion of the interposer 19b. The lateral surface 133 of the package body, the lateral surface 19b1 of the interposer 19b and the lateral surface 103 of the substrate are substantially coplanar.

The second antenna array 15 (including an antenna 15a) is disposed on the lateral surface 103 of the substrate 10, a lateral surface 19b1 of the interposer 19b and the lateral surface 133 of the package body 13. In some embodiments, an end-fire antenna array (including the antenna 15b) can be disposed on the lateral surface 104 of the substrate 10, the lateral surface 19b2 of the interposer and the lateral surface 134 of the package body 13.

FIG. 1C is a bottom view of the semiconductor package device 1 shown in FIG. 1A. The interposer 19b is arranged at or near an edge of the second surface of the substrate 10 and surrounds the electronic components 12a, 12b. An exposed portion of the via 19v may be arranged near a periphery of interposer 19b and can provide an electrical connection to at least one of the electronic components 12a, 12b.

Figure 1D:
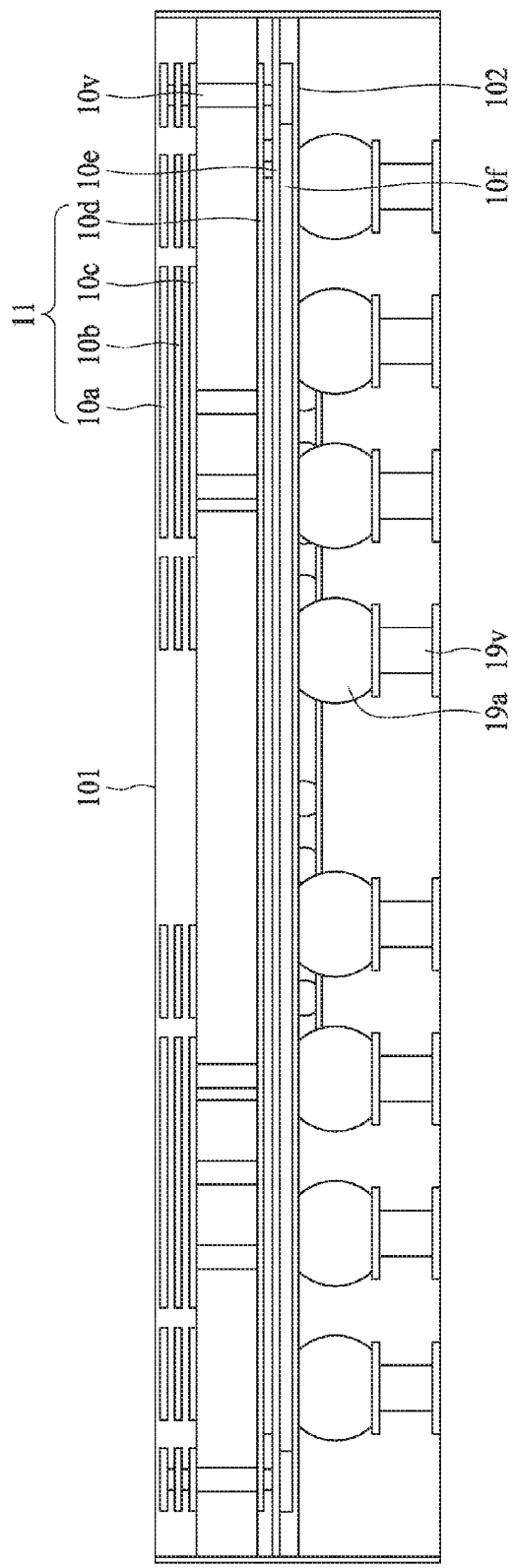
FIG. 1D illustrates a cross-sectional view of a semiconductor package device in accordance with some embodiments of the present disclosure.

FIG. 1D illustrates a cross-sectional view of the inner structure of the semiconductor package device 1 shown in FIG. 1A, in accordance with some embodiments of the present disclosure. As shown in FIG. 1D, the substrate 10 includes a first metal layer 10a, a second metal layer 10b, a third metal layer 10c, a fourth metal layer 10d, a fifth metal layer 10e and a sixth metal layer 10f. In other embodiments, the substrate 10 may include a different number of layers. The first, second and third metal layers 10a, 10b, 10c are adjacent to the first surface 101 of the substrate 10. The fourth, fifth and sixth metal layers 10d, 10e, 10f are adjacent to the second surface 102 of the substrate 10. The first, second and third metal layers 10a, 10b, 10c are each closer to the first surface 101 of the substrate 10 than are any of the fourth, fifth and sixth metal layers 10d, 10e, 10f. The fourth, fifth and sixth metal layers 10d, 10e, 10f are each closer to the second surface 102 of the substrate 10 than are any of the first, second and third metal layers 10a, 10b, 10c.

In some embodiments, the first antenna array 11 including a dual-polarization patch antenna, which is formed at least in part by the first metal layer 10a, the second metal layer 10b and the third metal layer 10c of the substrate 10. The first metal layer 10a, the second metal layer 10b and the third metal layer 10c are separated from each other by insulating materials. A signal can be transmitted between the first metal layer 10a, the second metal layer 10b and the third metal layer 10c by coupling. The patch antenna further has a feeding transmission line formed at least in part by the fourth metal line 10d. The feeding transmission line has two terminals: one for horizontal-polarization and another for vertical-polarization. The two terminals are electrically connected with the third metal layer 10c through vias 10v within the substrate 10 and can transmit or receive radio frequency (RF) signals.

Figure 1E:
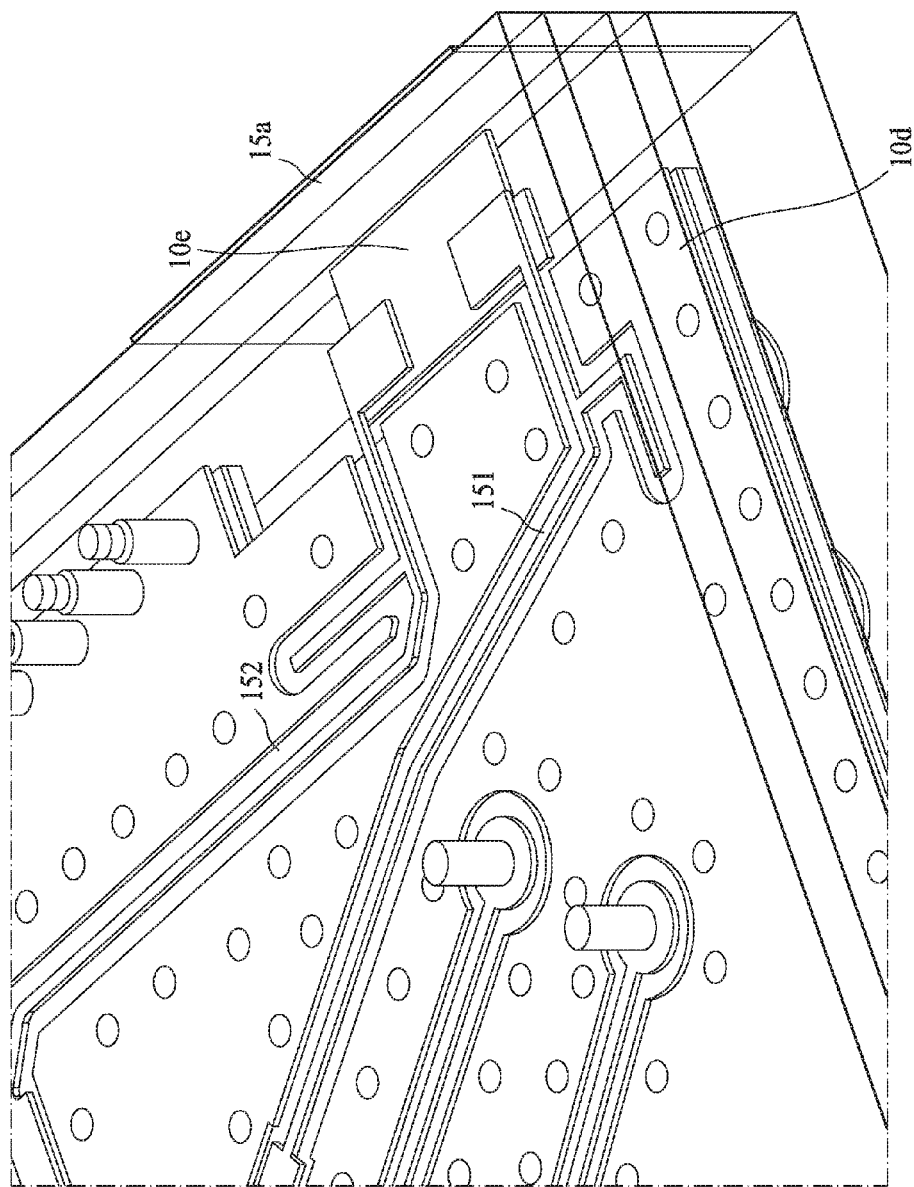
FIG. 1E illustrates an enlarged view of a portion of a semiconductor package device in accordance with some embodiments of the present disclosure.

FIG. 1E illustrates an enlarged view of the second antenna array 15 circled by a dotted line in FIG. 1A and labeled "B", in accordance with some embodiments of the present disclosure. In some embodiments, the second antenna array 15 includes a patch antenna 15a disposed on the lateral surface 103 of the substrate 10, the lateral surface 19b1 of the interposer 19b and the lateral surface 133 of the package body 13 (as shown in FIG. 1B). The patch antenna 15a is electrically connected with a portion of the fifth metal layer 10e that is exposed from the lateral surface 103 of the substrate 10 (e.g. the lateral surface 103 may define an opening that exposes the portion of the fifth metal layer 10e). The patch antenna 15a may directly contact the portion of the fifth metal layer 10e that is exposed from the lateral surface 103 of the substrate 10. The fifth metal layer 10e is isolated from the fourth metal layer 10d. A signal can be transmitted between the fourth metal layer 10d and the fifth metal layer 10e by coupling. For example, the differential transmission line 151, 152 in the fourth metal layer 10d can be coupled with the fifth metal layer 10e to transmit or receive signals via the patch antenna 15a.

As mentioned above, disposing a second antenna array 15 on a coplanar surface formed by the lateral surfaces the substrate 10, the interposer 19b and the package body 13 can increase a clean area in which the second antenna array is disposed without increasing the size of the package device. Therefore, for a given size, the semiconductor package device 1 in FIG. 1A could accommodate more antennas than otherwise, which can in turn increase a performance of the antenna array.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. Such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
   a substrate having a first surface, a second surface opposite to the first surface, and a first lateral surface extending between the first surface and the second surface;
   a first antenna disposed on the first surface of the substrate;
   an electronic component disposed on the second surface of the substrate;
   a package body disposed on the second surface of the substrate and encapsulating the electronic component, the package body having a first lateral surface substantially coplanar with the first lateral surface of the substrate; and
   a second antenna disposed on the first lateral surface of the substrate and on the first lateral surface of the package body.

2. The semiconductor package device of claim 1, wherein the substrate has a second lateral surface opposite to the first lateral surface of the substrate, the package body has a second lateral surface opposite to the first lateral surface of the package body, the semiconductor package device further comprising a third antenna disposed on the second lateral surface of the substrate and on the second lateral surface of the package body.

3. The semiconductor package device of claim 1, wherein the substrate has a second lateral surface opposite to the first lateral surface of the substrate and a third lateral surface extending between the first lateral surface of the substrate and the second lateral surface of the substrate, the package body has a second lateral surface opposite to the first lateral surface of the package body and a third lateral surface extending between the first lateral surface of the package body and the second lateral surface of the package body, the semiconductor package device further comprising a first metal strip disposed on the third lateral surface of the substrate and on the third lateral surface of the package body.

4. The semiconductor package device of claim 1, wherein the first antenna includes at least one patch antenna comprising a first metal layer, a second metal layer and a third metal layer each disposed adjacent to the first surface of the substrate.

5. The semiconductor package device of claim 1, further comprising a connection element disposed on the second surface of the substrate and encapsulated by the package body.

6. The semiconductor package device of claim 3, wherein the substrate has a fourth lateral surface opposite to the third lateral surface of the substrate, the package body has a fourth lateral surface opposite to the third lateral surface of the package body, the semiconductor package device further comprising a second metal strip disposed on the fourth lateral surface of the substrate and on the fourth lateral of the package body.

7. The semiconductor package device of claim 4, wherein the substrate includes a conductive via within the substrate, the semiconductor package device further comprising a fourth metal layer adjacent to the second surface of the substrate and electrically connected to the third metal layer through the conductive via within the substrate, wherein the fourth metal layer includes a first terminal and a second terminal.

8. The semiconductor package device of claim 5, wherein the connection element is a conductive pillar, a conductive hole or a bump.

9. The semiconductor package device of claim 5, further comprising an interposer electrically connected to the second surface of the substrate by the connection element, wherein at least part of the interposer is encapsulated by the package body.

10. The semiconductor package device of claim 6, further comprising a metal line disposed on the first surface of the substrate and connecting the first metal strip with the second metal strip, wherein the metal line is adjacent to the first lateral surface of the substrate.

11. The semiconductor package device of claim 6, further comprising a metal line disposed on the first surface of the substrate and connecting the first metal strip with the second metal strip, wherein the metal line is adjacent to the second lateral surface of the substrate.

12. The semiconductor package device of claim 7, further comprising a fifth metal layer adjacent to the second surface of the substrate and electrically connected to the second antenna, wherein the fifth metal layer is configured to electromagnetically couple with at least one of the first terminal and the second terminal of the fourth metal layer.

13. The semiconductor package device of claim 9, wherein the interposer has a lateral surface substantially coplanar with the first lateral surface of the package body, and wherein the second antenna is disposed on the lateral surface of the interposer.

14. A semiconductor package device, comprising:
   a substrate having a first surface, a second surface opposite to the first surface, a first lateral surface extending between the first surface and the second surface, a second lateral surface opposite to the first lateral surface, and a third lateral surface extending between the first lateral surface of the substrate and the second lateral surface of the substrate;
   a first antenna disposed on the first surface of the substrate;
   an electronic component disposed on the second surface of the substrate;
   a package body disposed on the second surface of the substrate and encapsulating the electronic component, the package body having a first lateral surface substantially coplanar with the first lateral surface of the substrate and a second lateral surface substantially coplanar with the second lateral surface of the substrate;
   a first metal strip disposed on the first lateral surface of the substrate and on the first lateral surface of the package body;

a second metal strip disposed on the second lateral surface of the substrate and on the second lateral surface of the package body, wherein the second metal strip electrically connects to the first metal strip; and a second antenna disposed on the third lateral surface of the substrate.

15. The semiconductor package device of claim 14, further comprising:

a first metal line disposed on the first surface of the substrate and electrically connecting the first metal strip to the second metal strip; and a second metal line disposed on the first surface of the substrate and electrically connecting the first metal strip to the second metal strip, wherein the second metal line is spaced apart from the first metal line.

16. The semiconductor package device of claim 14, wherein the substrate has a fourth lateral surface opposite to the third lateral surface of the substrate, the package body has a third lateral surface extending between the first lateral surface of the package body and the second lateral surface of the package body and a fourth lateral surface opposite to the third lateral surface of the package body, and the second antenna is further disposed on the third lateral surface of the package body, the semiconductor package device further comprising:

a third antenna disposed on the fourth lateral surface of the substrate and on the fourth lateral surface of the substrate.

17. A semiconductor package device, comprising:

a substrate including a first surface, a second surface opposite to the first surface, a first lateral surface extending between the first surface and the second surface, and a first metal layer;

an electronic component disposed on the second surface of the substrate;

a package body disposed on the second surface of the substrate and encapsulating the electronic component, the package body having a first lateral surface substantially coplanar with the first lateral surface of the substrate;

a first antenna disposed on the first lateral surface of the substrate and on the first lateral surface of the package body, wherein the first antenna electrically connects to the first metal layer of the substrate; and a second antenna disposed on the first surface of the substrate.

18. The semiconductor package device of claim 17, wherein the substrate includes a second metal layer isolated from the first metal layer and configured to electromagnetically couple with the first metal layer.

19. The semiconductor package device of claim 17, further comprising:

at least one connection element disposed on the second surface of the substrate and covered by the package body.

20. The semiconductor package device of claim 17, the substrate having a second lateral surface substantially perpendicular to the first lateral surface of the substrate and a third lateral surface opposite to the second lateral surface of the substrate, the semiconductor package device further comprising:

a first metal strip disposed on the second lateral surface of the substrate; and a second metal strip disposed on the third lateral surface of the substrate;

wherein the first metal strip is electrically connected to the second metal strip.

\* \* \* \* \*